United States Patent [19]

Lüth

[11] Patent Number: 5,122,853
[45] Date of Patent: Jun. 16, 1992

[54] ELECTRONIC COMPONENT, ESPECIALLY A PERMEABLE BASE TRANSISTOR

[75] Inventor: Hans Lüth, Aachen, Fed. Rep. of Germany

[73] Assignee: Forschungszentrum Julich GmbH, Julich, Fed. Rep. of Germany

[21] Appl. No.: 647,454

[22] Filed: Jan. 29, 1991

[30] Foreign Application Priority Data

Feb. 7, 1990 [DE] Fed. Rep. of Germany ....... 4003644
Aug. 9, 1990 [DE] Fed. Rep. of Germany ....... 4025269

[51] Int. Cl.$^5$ .............................................. H01L 29/72
[52] U.S. Cl. .......................................... 357/34; 357/56; 357/20
[58] Field of Search ................. 357/34, 20, 56, 226 R, 357/22 E, 22 G, 15, 22 V

[56] References Cited

U.S. PATENT DOCUMENTS

| | | | |
|---|---|---|---|
| 4,171,995 | 10/1979 | Nishizawa et al. | 357/58 |
| 4,758,534 | 7/1988 | Derkits, Jr. et al. | 357/56 X |
| 4,866,500 | 9/1989 | Nishizawa et al. | 357/20 X |
| 5,016,074 | 5/1991 | Sands | 357/34 |

Primary Examiner—William Mintel
Assistant Examiner—Roy Potter
Attorney, Agent, or Firm—Herbert Dubno

[57] ABSTRACT

An electronic component especially a permeable base transistor is provided as a composite of homoepitaxially grown layers so that space-charge zones defined by the permeable base are formed as pn-junctions between an n-conducting layer and a p-conducting layer.

1 Claim, 2 Drawing Sheets

ELECTRONIC COMPONENT, ESPECIALLY A PERMEABLE BASE TRANSISTOR

FIELD OF THE INVENTION

The present invention relates to an electronic component, especially a permeable base transistor (PBT), consisting of a composite of layers and having at least one controllable space-charge zone.

BACKGROUND OF THE INVENTION

For use in superconductors and high speed data networks for information processing and transmission, integrated circuits have been developed in the form of high speed microwave components. Of special significance in these systems are integrated circuits on GaAs chips, components based upon the GaAs/AlGaAs system, and like systems which have been employed to provide MESFET's and HEMT's, namely, field effect transistors in which the current transport is effected parallel to the surface of the chip.

An important speed-determining parameter, namely, the transit time beneath the gate, is given in such cases by the dimension of the lithographically generated lateral structuring of the gate (>0.2 micrometer).

As early as 1979, a permeable base transistor had been proposed generally in the form of a field effect transistor but having the current flow direction perpendicular to the chip surface so that the transit time under the gate, i.e. the gate length as a result of vertical structuring, was given by the thickness of the epitaxially deposited base layer.

By modern epitaxial methods, such as molecular beam epitaxy (MBE), metal-organic gas phase epitaxy or metal organic chemical vapor deposition (MOCVD) or metal-organic molecular beam epitaxy (MOMBE, CBE, GFMBE), metallic structured bases could be produced with layer thicknesses of the order of several atom layers.

In earlier systems, the metal base was structured with lateral fingers, between which current channels remained open and in which at the metal-semiconductor junction a Schottky barrier was formed to provide a depletion zone whose spatial extent could be varied by the bias voltage on the metal base. With a typical space-charge zone extent of about 1000 angstroms in the voltage free state, by appropriate choice of the bias voltage or potential one could provide an opening width of the base of 2000 to 5000 angstroms as controlled by the base bias or potential.

In the past the material from which this type of transistor was fabricated was silicon from which the base was grown in the form of metallic epitaxially grown nickel or cobalt silicides ($NiSi_2$, $CoSi_2$).

When GaAs is used as the basic material of the transistor, polycrystalline deposited metal structures were grown over the GaAs epitaxially from the side.

Furthermore, from time to time quasimetallic epitaxially grown Er-arsinide layer structures were discussed as base materials. Breakthrough results have not been attained heretofore at least with a GaAs system.

OBJECTS OF THE INVENTION

It is, therefore, the principal object of the present invention to provide an electronic component of the aforedescribed type whose manufacture does not require an heteroepitaxial deposition of metallic components like silicides, ErAs or the like and which will permit a defect free overgrowing of the base.

Another object of the invention is to provide an improved permeable base transistor with more effective control of the space-charge zones or zone thereof.

Still another object of the invention is to provide a method of making an improved electronic component, especially an improved permeable base transistor.

SUMMARY OF THE INVENTION

These objects and others which will become apparent hereinafter are attained, in accordance with the invention with an electronic component, especially a permeable base transistor, having a multiplicity of layers forming a composite and at least one space-charge zone. According to the invention, the space-charge zone is formed as a pn-junction between a p-conducting layer and an n-conducting layer.

More particularly, an optical component according to the invention comprises a plurality of layers forming a homoepitaxial composite, having at least one voltage-controllable space-charge zone and having at least an emitter, a base and a collector, the space-charge zone being formed as a pn-junction between an n-conducting layer and a p-conducting layer.

The permeable base transistor, more particularly, can have a space-charge zone whose extent is controllable by a base bias voltage and can comprise:

a first GaAs-based n-conducting layer epitaxially grown on a GaAs(100) wafer and having a n-doping of substantially $10^{17}$ to $10^{18}$ cm$^{-3}$;

a GaAs-based p$^+$-conducting layer epitaxially grown on the n-conducting layer and having a multi-finger configuration to define a base of the transistor with space-charge regions formed by pn-junctions around fingers of the p$^+$-conducting layer collectively forming a space-charge zone of an extent controllable by a bias voltage on the base, the p$^+$-conducting layer having a p$^+$-doping of carbon of substantially $10^{20}$ to $10^{21}$ cm$^{-3}$;

a second GaAs-based n-conducting layer epitaxially grown on the p$^+$-conducting layer and upon the first n-conducting layer and having a n-doping of substantially $10^{17}$ to $10^{18}$ cm$^{-3}$; and respective terminals connected to the wafer to form a collector of the transistor, to the second n-conducting layer to form an emitter of the transistor, and to the base.

When the component is a GaAs integrated component, the p-conducting layer can be composed of carbon-doped GaAs while the n-conducting layer is also composed of GaAs, doped preferably with Si, $SiH_4$, $Si_2H_6$, S, $H_2S$.

By contrast with the above described prior art permeable base transistor, whose space-charge zone has a controllable extent dependent upon the metal-semiconductor contact forming the Schottky barrier, with the system of the invention, which can be referred to as a p and n permeable base transistor, the space-charge zone is formed by a p and n junction which, depending upon the n-doping of the GaAs base material ($10^{17}$ to $10^{18}$ cm$^{-3}$) can extend about 500 to 1000 angstroms into the layer, i.e. into the current carrying region. On the other side, i.e. in the quasimetallic p$^+$-base, the extent of the space-charge region corresponding to the high doping level is less than 50 angstroms.

Because of the strong p$^+$-doping, the base possesses quasimetallic conductivity properties space charge capacities in the region of the base p and n junction are comparable with those in the corresponding Schottky barrier prior art permeable base transistor (limited extent of the p+space-charge zone).

With respect to the method aspect of this invention, the method comprises forming a permeable base transistor with at least one space-charge zone formed by a p-conducting layer bonded to an n-conducting layer to provide the pn-junction. The process of the present invention is distinguished by its simplicity since the permeable base transistor of the invention need only be composed of one material, namely GaAs with appropriate doping distinguishing the layers.

In general terms, therefore, in a method of making an electronic component comprising a plurality of layers forming a homoepitaxial composite having at least one voltage-controllable space-charge zone and having at least an emitter, a base and a collector, the improvement of the invention comprises the step of forming the space-charge zone as a pn-junction between an n-conducting layer and a p=conducting layer.

A more specific method of the invention comprises the steps of:

(a) depositing a first GaAs-based n-conducting layer epitaxially on a GaAs(100) wafer with an n-doping of substantially $10^{17}$ to $10^{18}$ cm$^{-3}$;

(b) then depositing a GaAs-based p+-conducting layer epitaxially on said n-conducting layer with a multi-finger configuration to define a base of said transistor with space-charge regions formed by pn-junctions around fingers of said p+-conducting layer collectively forming a space-charge zone of an extent controllable by a bias voltage on said base, said p+-conducting layer being formed with a p+-doping of carbon of substantially $10^{20}$ to $10^{21}$ cm$^{-3}$;

(c) thereafter depositing a second GaAs-based n-conducting layer epitaxially on said p+-conducting layer and upon said first n-conducting layer with an a n-doping of substantially $10^{17}$ to $10^{18}$ cm$^{-3}$; and (d) applying respective terminals connected to said wafer to form a collector of said transistor, to said second n-conducting layer to form an emitter of said transistor, and to said base.

In the formation of GaAs integrated component of the invention, t he p-conducting layer is composed of GaAs in which the p-(hole)-doping is effected by the incorporation of carbon in the GaAs base.

The p-doping with inclusion of carbon can be effected by the MOMBE deposition of GaAs by means of trimethylgallium (TMG) with a p-doping of from approximately $10^{20}$ to $10^{21}$ cm$^{-3}$. By selection of the growth parameters, it is possible to generate a quasimetallic p-conducting layer of GaAs whose thickness is controlled to the MOMBE process to be of atomic dimensions (several angstroms).

As the base material for producing the n-conducting layer, GaAs is also selected, the n-doping of the GaAs being effected with elemental silicon or elemental sulfur as doping agents or the corresponding hydrides such as SiH$_4$, Si$_2$H$_6$, and H$_2$S. Trimethylgallium (TEG) can be used as a source material in the epitaxial growth of a pure GaAs and can be employed concurrently with these doping agents for the n-doping process.

The present process, utilizing GaAs as a basic material, yields a permeable base transistor whose permeable base is not constituted by a metallic component but, by contrast, has a high p-conducting (hole) character. The high p+-conduction ($p \approx 10^{21}$ cm$^{-3}$) is generated by carbon acceptors.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION AND EXAMPLE

Figure 1:
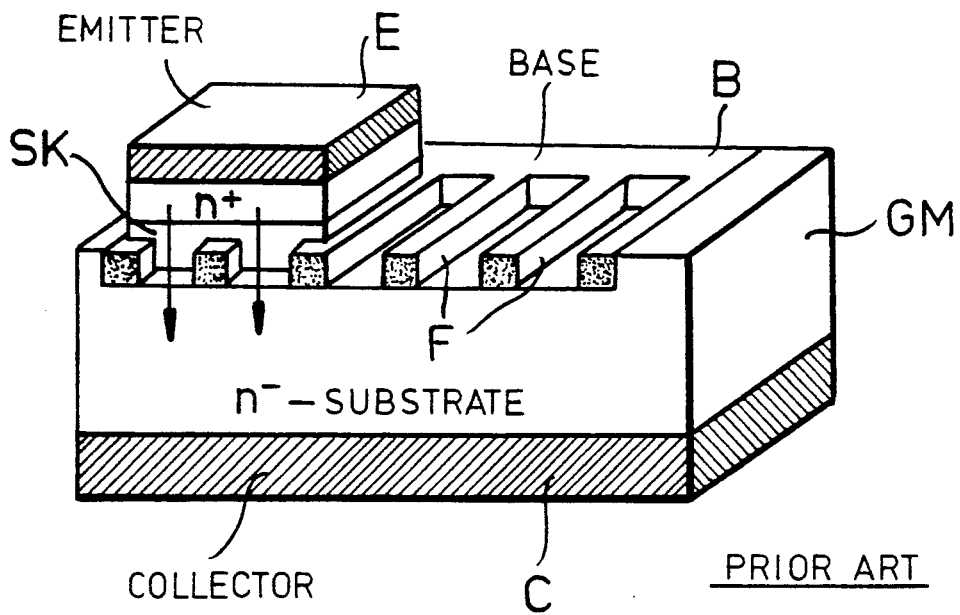
FIG. 1 is a cross sectional perspective view diagrammatically illustrating a prior art permeable base transistor.
Figure 6:
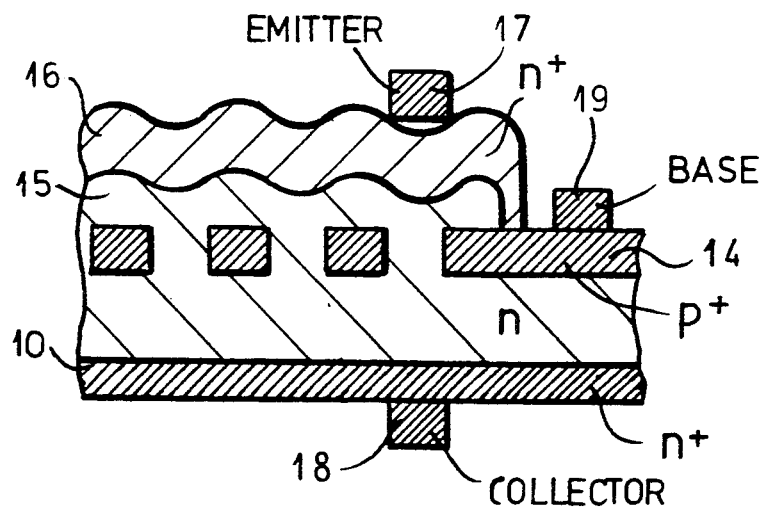
FIG. 6 is an illustration in cross section of the permeable base transistor after further steps in the process.

Turning first to FIG. 1, it can be seen that a permeable base transistor in accordance with prior art principles generally had a metallic base B formed with a lateral finger-like structure such that the fingers F define current channels SK between them from the emitter E through the base material GM to the collector C at the metal/semiconductor transitions, Schottky barriers were formed which constituted the depletion zones mentioned previously.

FIGS. 2 to 6 illustrate the principles of the present invention and especially the fabrication of a permeable base transistor in which, instead of the Schottky barriers of the metal/semiconductor junctions, p+n-junctions form the space-charge zones of variable extent depending upon the base bias potential.

Figure 2:
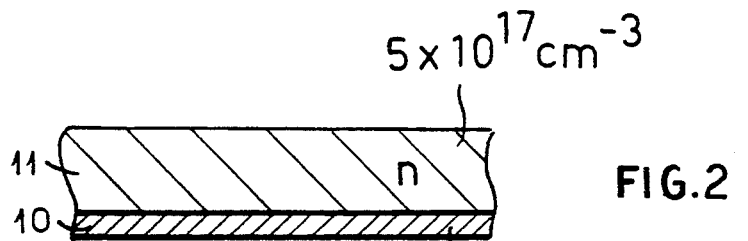
FIG. 2 is a diagram illustrating a first step in the process of the invention.

In FIG. 2, a GaAs(100) wafer 10 is formed, as the starting material for growing the permeable base transistor, with an upper layer 11 of n-doped GaAs to a thickness in excess of 1000 angstroms by means of metal organic molecular beam epitaxy deposition (MOMBE) using TEG. This forms the collector region which can have an n-doping of about $n = 5 \times 10^{17}$ cm$^{-3}$. Metallorganic chemical vapor deposition (MOCVD) can also be used for this purpose.

Figure 3:
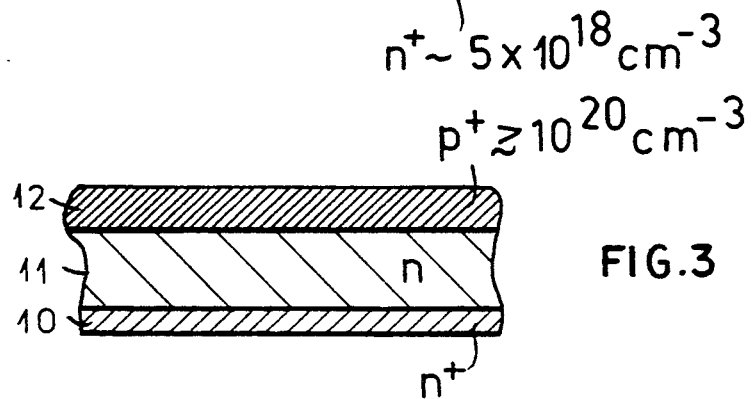
FIG. 3 is a diagram illustrating a second step in the process.

In the next step, another GaAs layer 12 is epitaxially grown or deposited on the layer 11 (see FIG. 3). In this case, the MOMBE process is used to deposit GaAs to a thickness which can be between 1000 and 10000 angstroms or substantially less if desired, the MOMBE process being carried out with TMG. With a sufficiently high III/V ratio, this process gives rise to an extremely high p+-doping which may be greater than $10^{20}$ cm$^3$. This process can also be carried out by MOCVD with the use of hydrocarbons to similar high p-dopings. The reference to the III/V ratio is of course a reference to the atomic ratio of the gallium (representative of a Group III element of the Periodic Table to arsenic, representative of a Group V element of the Periodic Table).

Figure 4A:
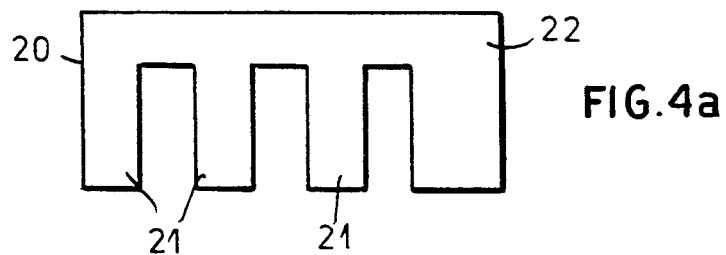
FIG. 4a is a plan view of a mask utilized in this third step.
Figure 4:
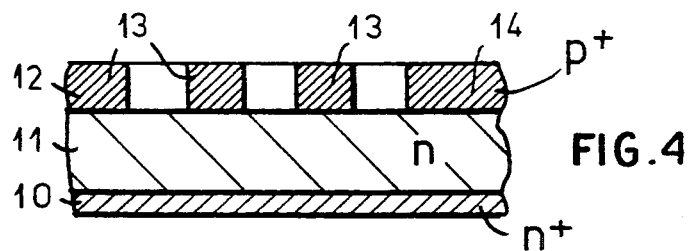
FIG. 4 is a cross sectional view showing a third step in the process of making the permeable base transistor according to the invention.

The next step requires an interruption in the GaAs grown and an external lithographic structuring of the p+-layer 12 by means of a mask as shown at 20 in FIG. 4a and which has fingers 21 and a terminal region 22, thereby producing fingers 13 and a land (i.e. an immodified region) 14 in the layer 12 to constitute the base of the transister (FIG. 4).

Figure 5:
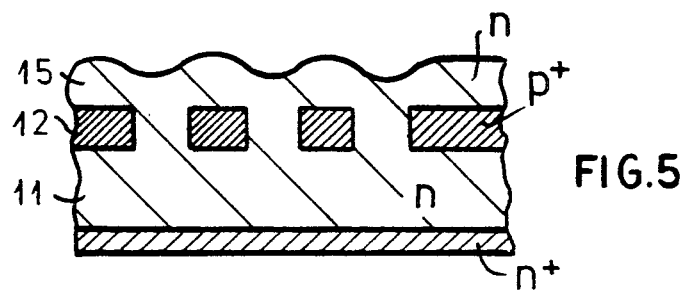
FIG. 5 is a cross sectional view illustrating a fourth step in the process.

As can be seen from FIG. 5, the n-conducting layer 11 is then overgrown onto the p+-layer 12 to produce another layer 15 of the n-doped GaAs, using TEG and a doping compound corresponding to the doping compound used in the first step, for example elemental elemental silicon to a doped level of approximately $5 \times 10^{17}$ cm$^{-3}$. The same MOMBE deposition technique used in the first step is repeated here.

Subsequently an n+-layer 16 is epitaxially grown on the n-conducting layer 15 and can have an n-doping greater than or equal to $10^{19}$ cm$^{-3}$. An emitter contact zone 17 can then be formed on this layer 16 while a collector contact zone 18 is applied to the n+-layer 10. The n+ and n-layers 16 and 15 are etched away to expose the land 14 and a base terminal or contact 19 is applied thereto (see FIG. 6).

I claim:

1. A permeable base transistor having a space-charge zone whose extent is controllable by a base bias voltage, said permeable base transistor comprising:
   a first GaAs-based n-conducting layer epitaxially grown on a GaAs-(100) wafer and having a n-doping of substantially $10^{17}$ to $10^{18}$ cm$^{-3}$;
   a GaAs-based p+-conducting layer epitaxially grown on said n-conducting layer and having a multi-finger configuration to define a base of said transistor with space-charge regions formed by pn-junctions around fingers of said p+-conducting layer collectively forming a space-charge zone of an extent controllable by a bias voltage on said base, said p+-conducting layer having a p+-doping of carbon of substantially $10^{20}$ to $10^{21}$ cm$^{-3}$;
   a second GaAs-based n-conducting layer epitaxially grown on said p+-conducting layer and upon said first n-conducting layer and having an n-doping of substantially $10^{17}$ to $10^{18}$ cm$^{-3}$; and
   respective terminals connected to said wafer to form a collector of said transistor, to said second n-conducting layer to form an emitter of said transistor, and to said base.

* * * * *